United States Patent [19]
Vale et al.

[11] Patent Number: 5,084,687
[45] Date of Patent: Jan. 28, 1992

[54] SURFACE ACOUSTIC WAVE ENCODER/DECODER

[75] Inventors: Christopher R. Vale, Elkridge; John W. Taylor, Jr., Baltimore, both of Md.

[73] Assignee: Westinghouse Electric Corp., Pittsburgh, Pa.

[21] Appl. No.: 99,360

[22] Filed: Dec. 3, 1979

[51] Int. Cl.⁵ .................. H03H 9/00; H04B 11/00
[52] U.S. Cl. ................................................. 333/153
[58] Field of Search ................................. 333/150, 153

[56] References Cited

U.S. PATENT DOCUMENTS

| | | | |
|---|---|---|---|
| 3,675,054 | 7/1972 | Jones et al. | 333/150 X |
| 3,675,163 | 7/1972 | Hartmann et al. | 333/150 |
| 3,969,590 | 7/1976 | Jain et al. | 333/150 X |
| 4,056,803 | 11/1977 | White et al. | 333/150 X |
| 4,059,831 | 11/1977 | Epstein | 333/150 X |
| 4,151,492 | 4/1979 | Sandy et al. | 333/150 X |

FOREIGN PATENT DOCUMENTS

| | | | |
|---|---|---|---|
| 2520057 | 11/1975 | Fed. Rep. of Germany | 333/153 |
| 0028840 | 3/1977 | Japan | 333/150 |

Primary Examiner—Theodore M. Blum
Attorney, Agent, or Firm—W. G. Sutcliff

[57] ABSTRACT

A unitary surface acoustic wave device for continuous quadraphase coding of a high amplitude video impulse with provisions for controlling the rise and fall times of such impulse.

10 Claims, 3 Drawing Sheets

SURFACE ACOUSTIC WAVE ENCODER/DECODER

BACKGROUND OF THE INVENTION

The present invention relates to a surface acoustic wave (SAW) device; and more particularly, to such a device that converts a large amplitude video impulse (or a short burst of sine waves) to a phase coded pulse, or decodes such phase coded pulse to generate a large amplitude short pulse.

Surface acoustic wave (SAW) devices, which convert electrical energy into acoustic energy, and reconvert acoustic energy into electrical energy are well known. Such surface acoustic wave devices typically comprise metallized interdigital transducer elements formed on the surface of a piezoelectric substrate, which substrate may be quartz or lithium niobate, for example. These devices may be easily fabricated by optically polishing a single surface of the piezoelectric substrate, depositing the metal film on the polished surface, and then forming the transducer elements using standard photolithography techniques.

In connection with radar systems, or communication systems, it is sometimes desirable to transmit pulses which are distinctly coded in order to discriminate against received or echo pulses that are not so coded.

Heretofore, phase coded pulse generators have been constructed from surface acoustic wave devices. Such devices typically utilized what may be termed a bi-phase code wherein the phase modulation changes instantaneously between two states; that is, between zero and 180°, for example. In other words, such SAW devices utilized interdigital fingers on the piezoelectric substrate to produce phase reversed output signals resulting in the bi-phase code. For example, U.S. Pat. No. 3,961,290 discloses a programmable phase coded surface wave acoustic device wherein various taps on the interdigital elements or fingers are severed from the common conducting bar to selectively reverse the phase of the surface acoustic wave with each tap constituting a binary bit. Although bi-phase SAW devices accomplished the purposes intended, such bi-phase coding is readily discernible and exhibits a broad output spectrum causing undesirable interference.

In order to overcome the easy identification and the wideband spectrum characteristics of the bi-phase coded generators, it was proposed to utilized a code generator that provided a quadraphase code; that is, that the phase of the pulses shifted 90° rather than 180°; furthermore, the phase was to change gradually during the bit period. Such quadraphase coded generators were frequency shift coded, and were constituted by electronic devices with logic circuitry and modulators. The frequency was shifted from a center, or carrier frequency, utilizing complicated modulating gates. The modulated gates were required to insure a constant output level over the center portion of each pulse. Such electronic quadraphase code generators were not only relatively expensive but they also consumed a substantial amount of power, required a separate shaping filter to control the rise and fall time of the pulses to be coded, and occupied a large volume.

Heretofore, it was also proposed to generate the quadraphase code by coherently impulsing a surface acoustic wave delay line. Such a device consisted of two interleaved 13 bit Barker bi-phase codes which are summed in such a way that one of the codes is in quadrature with the other. By shifting one of the two decoder patterns with respect to the other by one half of bit, and then shifting it again by one quater of a cycle, the essential elements of the quadraphase code are realized once the two patterns are summed, which apparatus is also relatively complicated.

Thus, it is desirable not only to eliminate the complicated electronic encoder to generate the frequency shift codes, but also to provide a simplified SAW device for providing a continuous phase coding with controlled rise and fall times. Further, it is desirable to provide such a SAW device that is capable of being used as an encoder and decoder and may be readily fabricated to generate a plurality of different quadraphase codes with selected rise and fall times of the pulse to be coded.

SUMMARY OF THE INVENTION

In accordance with the present invention, a unitary surface acoustic wave encoder/decoder device is provided for generating a continuous phase coded pulse having provision for controlling the rise and fall times of the pulse.

More specifically, in accordance with the present invention, a surface acoustic wave device for the encoding or decoding of video impulses, each having a duration not exceeding approximately one half the sine wave of a selected center frequency, is provided. The device has a first array of interdigital electrodes disposed on a piezoelectric substrate that are configured to convert the video impulses to an acoustic wave train having half sine wave time weighting by varying the finger length with gaps. A second array of interdigital electrodes is disposed on the substrate and spaced from the first set in the direction of wave propagation a selected distance that determines absolute delay. The second array is configured to introduce sequentially and continuously a plurality of predetermined phase changes in the half sine wave pulse propagated from the first array to provide a resulting phase coded acoustic wave form. In the preferred embodiment, each phase change of the code is 90° linearly accomplished over the duration of each bit of the code.

DESCRIPTION OF THE PREFERRED EMBODIMENT

Figure 1:
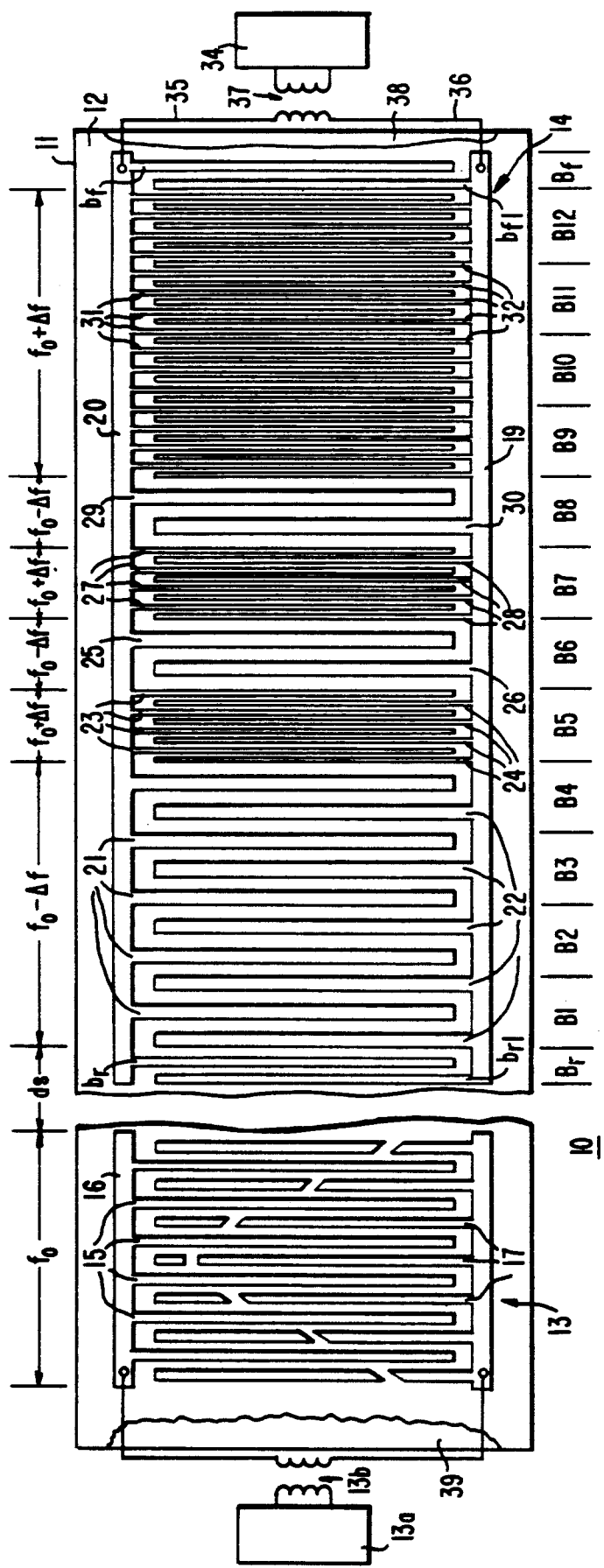
FIG. 1 is a diagrammatic representation of a surface acoustic wave device in accordance with one embodiment of the present invention.

Referring to FIG. 1, a surface acoustic wave device generally referred to as 10 comprises a piezoelectric substrate 11 having a polished surface 12 on which is deposited a first continuous metallized pattern or array 13 extending a predetermined distance corresponding to one bit width along the length of the substrate surface 12; and a second continuous metallized pattern or array generally referred to as 14, which pattern is spaced a predetermined distance from the first metallized pattern along the length of the substrate 11 in the direction of wave propagation. The metallized pattern 13 comprises a plurality of parallel fingers 15 extending from a common conductor 16 on the surface 12 of the piezoelectric substrate 11 transverse to the direction of wave propagation; and parallel fingers 17 interdigitally positioned with respect to the fingers 15 extending from a common conductor 18. The interdigitated fingers 15 and 17 are of equal dimension in the direction of wave propagation, which dimension is referred to as finger width; and are equally spaced the same distance from each other a distance corresponding to the finger width, which distance is referred to as the space width. Each pair of fingers 15 and 17 and the pair of spaces adjacent thereto, or in other words two fingers and two spaces have a total width corresponding to the surface wavelength, $\lambda_s$, of a selected center frequency $f_o$. The total width of such a finger-pair may be calculated in accordance with the well known formula $$\lambda_s = \frac{V_s}{f_o}$$

where $V_s$=the velocity of a surface wave, which for example, on a quartz substrate is 3150 meters per second. The fingers 17 which extend from the common conductor 18 have gaps cut therein, with such gaps or discontinuities forming a launching pattern to yield a half sine wave time weighting of the center frequency $f_o$. The pattern 13 with the pattern of the gaps in the fingers 17 actually constitute a rise and fall time shaping filter because each pulse train has a half sine wave weighting configuration at the selected center frequency $f_o$ at the output of the metallized pattern 13. Many other rise and fall shapes may be realized with other gap patterns. In order to illustrate a typical weighting configuration, the pattern 13 is shown extended beyond or greater than one bit width. In actual practice, the pattern 13 extends one bit width, such as B1, B2 etc. of pattern 14.

Figure 3:
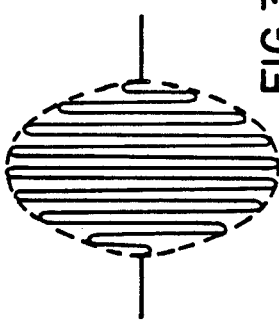
FIG. 3 illustrates the input pulse of FIG. 2 prior to entering the encoding portion of the SAW device of the present invention.
Figure 2:
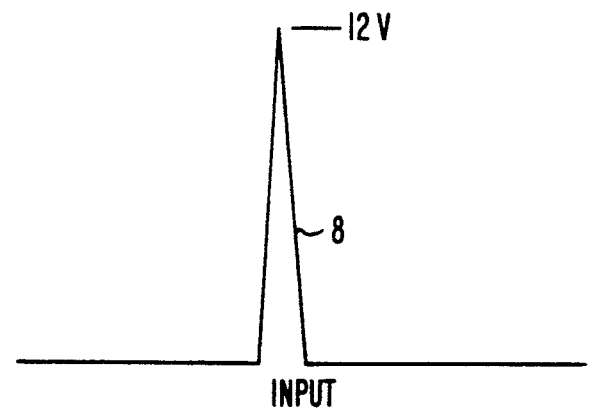
FIG. 2 represents a typical input pulse for utilizing the present invention as an encoder.

Referring to FIG. 2, a wave form referred to at P represents a large amplitude video pulse that is applied to the metallized pattern 13 through source impedance 13a and matching transformer 13b when the device 10 is used as an encoder. FIG. 3 represents the input pulse as it leaves the metallized pattern. Thus, the pattern 13 is a filter whose impulse response has a half sine wave shape and is approximately one bit width at the base; its effect is shown by lines R and F illustrating rise and fall times of the encoded pulse of FIG. 4. The effect of the filter 13 is to give an integral-of-sine rise and fall shape to the quadraphase encoded pulse. In turn, this serves to further limit the spectrum of the encoded pulse. Applying an impulse such as shown at P in FIG. 2, that is shorter or equal to one half of a sine wave of the carrier or center frequency $f_o$, which may be 30 megahertz for example, starts a weighted acoustic wave train traveling from left to right as viewed in FIG. 1 which passes under the encoding array 14. The distance or gap referred to as $d_s$ between the end of the pattern 13 and the pattern 14 in FIG. 1 is selected so that electrical isolation can be maintained between the input of the array 14 and the output of the array 13.

Figure 5:
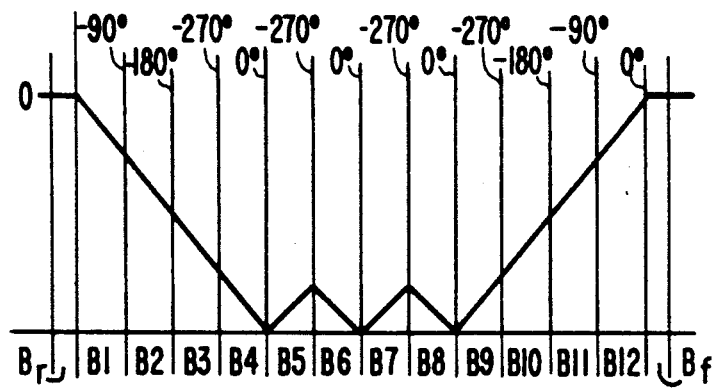
FIG. 5 shows the phase history of the pulse so encoded.

Referring to FIG. 5 in conjunction with FIG. 1, the phase coding of the described embodiment of the present invention involves a continuous phase change of 90° for each bit of the phase code, excluding the rising and falling edges of the pulse. Prior to describing in detail the encoding/decoding array 14, it should be mentioned that the specific array to be described is configured to provide a specific phase code, by way of example, and that other codes may be configured in accordance with the teachings of the present invention. As shown in FIG. 5, the phase of the center frequency prior to propagating beneath code bits B1 through B12 of the array 14 is assumed to be zero degrees (0°). As it propagates thereunder along the length of the array 14 from left to right or in other words from B1 through B12 as shown in FIG. 1, the phase changes continuously so that at the end of the first bit B1, a −90° phase change has occurred. During the second bit B2, the phase changes another 90° to be at −180°. At the end of the third bit B3, the phase is at −270°; and at the end of the fourth bit B4, the phase is at 0° (which is the same as −360°). During the fifth bit B5, the phase changes from 0° to −270°, and during the sixth bit B6, from −270° to 0°. During the seventh bit B7, the phase changes back to −270° and returns to 0° at the end of the eighth bit B8 in a continuous fashion. During each of the remaining bits B9 through B12, the phase changes 90° from 0° through −270°, −180°, −90° and 0° continuously as shown in FIG. 5.

Referring again to FIG. 1, the metallized encoding array 14, which is spaced from the shaping filter 13 extends along the length of the surface 12 of the substrate 11 in the direction of wave propagation a distance corresponding to the total number of bits selected for each coded pulse plus the distances referred to as $B_r+B_f$, each of which is ½ of a bit width. The array 14 is comprised of a pair of parallel spaced common conductors 19 and 20 that extend throughout the length of the array 14.

Extending transverse to the direction of wave propagation from the common conductors 19 and 20 are a plurality of interdigitated fingers $b_r$, $b_{rl}$, 21 through 31, $b_f$ and $b_{fl}$ that are consecutively disposed in the direction of wave propagation. The fingers $b_r$, $b_{rl}$, $b_f$ and $b_{fl}$ are the same width and spacing as the center frequency 15 and 17 of the array 13 to provide a reference for each pulse entering and leaving the array 14. The selection of the finger width and space width for the fingers 21 through 31 of the array 14 varies from the finger width and space width of the fingers 15 and 17 of the array 13 to provide the continuous phase change in accordance with the present invention. Each single finger width of the fingers 15 and 17 is equal to ¼ of a wavelength $\lambda_s$, and each adjacent space width is equal to ¼ of a wavelength $\lambda_s$; thus, a pair of fingers 15 and 17 and the pair of adjacent spaces total one wavelength of the center frequency $f_o$. Since such finger width and space width pair for one wavelength represents a 360° phase change, $\frac{1}{4}$ of such finger width and space width, such as is provided by a pair of fingers and the intervening space, for example, effects a 90° phase change, and one finger width and one space adjacent thereto represents a 180° phase change. Each bit length, for all practical purposes, should be at least the distance corresponding to one period of a selected center frequency to prevent sharp excursions of phase; and the longer the bit length, the less frequency change $\Delta_f$ that is required to provide the desired phase change at the end of each bit. For example, if each bit length of the code is to be twice that of one period of the center frequency $f_o$ and a continuous phase change of 90° for each bit is required; then the $\frac{1}{4}$ wavelength $f_o$ is substracted from each total bit length. It follows that if a continuous phase change of 120° for each bit is required, then the total bit length is less by $\frac{1}{3}$ of a wavelength $f_o$. Since the wavelength change $\Delta_f$ is allocated proportionally to each one of the finger widths and space widths thereby making up the total desired wavelength change over the entire bit, the frequency change from the center frequency is less than that required if the entire bit length were equal to only one period of the center frequency. Thus, assuming the first bit B1, for example, represents a −90° phase change, and the bit corresponds in length to two periods of center frequency, each finger width and spacing is increased proportionally such that there are fewer fingers with greater spacing therebetween to accomplish the −90° phase shift. Assuming that a succeeding bit such as B8 is to shift continuously from −90° back to 0°, the bit length includes equal finger widths and space widths that are each proportionally narrower than that provided for the center frequency $f_o$. Thus, the proportionate part of the $\frac{1}{4}$ wavelength is equally substracted from each finger width and space width to provide the total change of $\frac{1}{4}$ wavelength over the entire bit length. Each finger pair of a particular bit provides only a portion of the required 90° phase shift for the entire bit. Thus, the longer the bit, the less dimension change that is required in each finger width and each space width from the center frequency to effect the desired phase change over the entire bit length. At the end of each bit, the width of the space adjacent the last finger of the bit, or the width of the finger adjacent the last space of the bit as the case may be, is equal to $\frac{1}{4}$ of the wavelength of the frequency for the next succeeding bit in the direction of wave propagation. All of the bit lengths referred to as B1 through B12 herein are equal. Although bits B1 through B4 and B9 through B12 have equal finger widths and spacing, it is understood that for a different code the finger widths and spacing would change for selected succeeding bits. It is noted that although FIG. 1 illustrates distinctly, the difference in finger widths and spaces for a certain of the bits B1 through B12, in actual practice such change in dimension would be so slight, as not to be apparent to the human eye.

Figure 4:
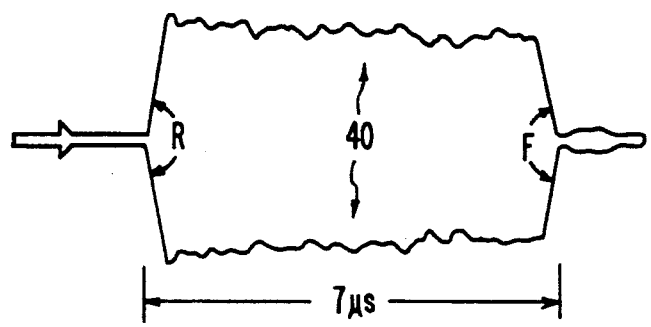
FIG. 4 illustrates an output pulse and its rise time after being encoded by a device constructed in accordance with the present invention.

For that portion of the code constituting bits B1 through B4 a plurality of parallel spaced fingers 21 extend from the conductor 20 in a direction transverse to the direction of wave propagation; and a plurality of parallel spaced fingers 22 extend from the conductor 19 between the fingers 21 to form with the fingers 21 an interdigitated pattern having a finger width and spacing corresponding to the center frequency $f_o$ minus a change in frequency $\Delta_f$ sufficient to change the phase of the pulse −90° in one bit length of the code. In the present embodiment, the center frequency of 30 megahertz is assumed and the required change in frequency $\Delta_f$ is $\frac{1}{2}$ megahertz so that the fingers 21, 22 have a width and space width corresponding to 29.5 megahertz. Since the change of phase in the present embodiment is in the same direction for all four bits B1 through B4, the finger width and space width of fingers 21 and 22 is the same throughout all four bits. Immediately adjacent the fingers 21 and 22, in the direction of wave propagation and extending from the common conductors 20 and 19 are parallel interdigitated fingers 23 and 24 respectively. The interdigitated fingers 23 and 24 have a width and space width in accordance with a frequency that corresponds to the center frequency $f_o$ plus a change in frequency $\Delta_f$ to change the phase in the opposite direction 90° from the 0° phase at the end of the fourth bit. In the present example, such frequency shift would be 1 megahertz from the previous bit, or in other words, 30.5 megahertz to provide a 270° phase at the end of the bit B5. Interdigitated parallel fingers 25 and 26 which extend from the common conductors 20 and 19, respectively are similar in width and spacing to the previously mentioned interdigitated fingers 21 and 22 to change the frequency to 29.5 megahertz to shift the phase continuously in the opposite direction from −270° to 0° during bit B6. Adjacent the fingers 25 and 26 are a plurality of interdigitated fingers 27 and 28 extending from conductors 20 and 19 respectively that are of similar width and spacing as the fingers 23 and 24 to change the frequency from 29.5 megahertz to 30.5 megahertz to provide a 90° phase shift in the opposite direction at the end of bit B7 to −270°. Similarly, since bit B8 requires a phase shift of 90° in the reverse direction interdigitated fingers 29 and 30 which are adjacent interdigitated fingers 27 and 28 and extend from the common conductors 20 and 19 respectively, have a finger width and spacing similar to the fingers 21 and 22 and 25 and 26 to change the frequency to 29.5 megahertz or in other words, $\frac{1}{2}$ megahertz less than the center frequency $f_o$. Finally, since the particular code of the present embodiment is in the same direction for the remaining bits B9 through B12 interdigitated parallel fingers 31 and 32 which have width and spacing to change the frequency from 29.5 megahertz to 30.5 megahertz, are immediately adjacent the fingers 29 and 30 in the direction of wave propagation and extend transverse to the direction of such propagation from the common conductors 20 and 19 respectively through the remaining length of the array 14. Such width and spacing results in a continuous phase change in the same direction so that the bit coding for the remaining four bits is −270°, −180°, and −90° and 0°. When the device 10 is used as an encoder, the encoded pulse is output to a load impedance 34 for amplification and transmission by way of the common conductors 19 and 20 that are connected preferably through a toroidal transformer 37, the secondary winding of which is connected to lines 35 and 36. Conventional acoustic absorbing material, such as RTV, and referred to at 38 and 39 is deposited at opposite ends of the substrate 11 on the surface 12 to prevent acoustic reflection of the transmitted or received pulses. It should be noted that the resulting encoded output pulse 40 of FIG. 4 which, as previously mentioned illustrates the rise and fall times referred to at R and F, is not obviously encoded because the continuous phase transmissions are smooth, and not abrupt. This contrasts starkly with a bi-phase encoded pulse where the phase transitions are obvious. The slight taper in amplitude of the encoded pulse 40 as shown in FIG. 4 as it extends from left to right as viewed in the drawing is caused by energy under the encoding pattern 14 reducing while the traveling wave is propagating under the pattern. This taper, if desired, may be eliminated by putting a reverse taper in the overlap of the encoding pattern 14.

Figure 6:
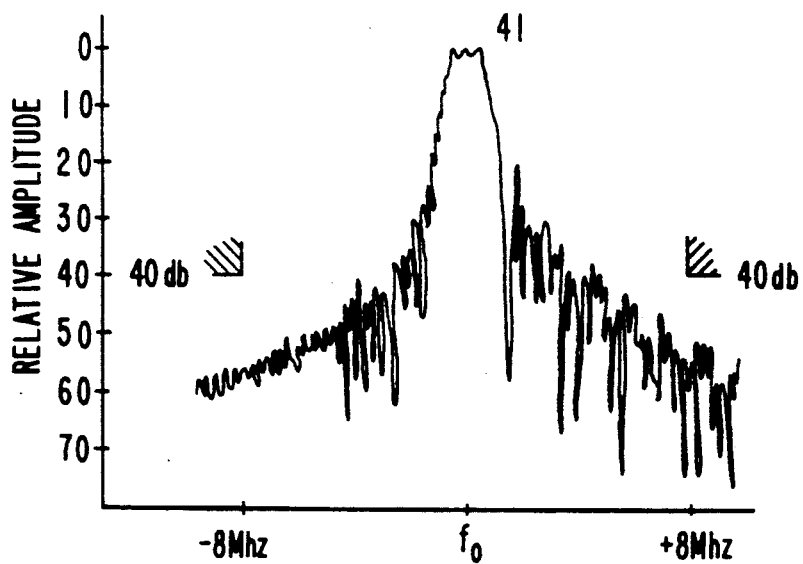
FIG. 6 illustrates a broad spectrum view of an output pulse encoded by a device constructed in accordance with the present invention.

Referring to FIG. 6, the frequency spectrum of a pulse encoded in accordance with the described embodiment is shown with the portion of greatest amplitude being approximately one megahertz greater and one megahertz less than the center frequency $f_o$ as noted by the bracketed portion of the pulse referred to at 41. It should also be noticed that the width of the spectrum 40 dB below its peak is substantially less than the requirements of the Office of Telecommunication Policy, thus illustrating and confirming the value of the quadraphase coding in accordance with the present invention.

Figure 7:
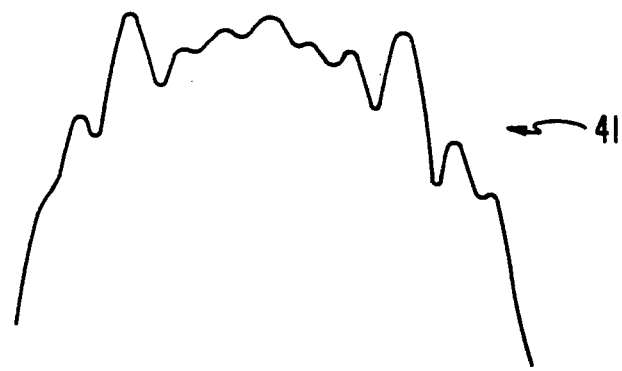
FIG. 7 is an enlarged illustration of the central top portion of the spectrum of FIG. 6 to show a more detailed spectrum.

Referring to FIG. 7, which shows greatly enlarged, the portion 41 of the pulse of FIG. 6 illustrates the frequency variations as they result in the attenuation of the spectrum a distance of one half megahertz at each side of the center frequency $f_o$.

Figure 8:
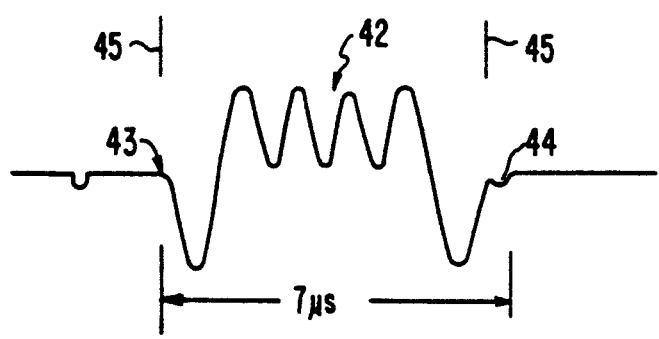
FIG. 8 illustrates the wave form at the output of a phase detector when compared against a coherent sine wave.

Referring to FIG. 8, which illustrates the phase of the pulse changing with time, was produced by comparing the phase with a coherent sine wave in a phase detector. The resulting filtered output pattern is referred to at 42. Ledges 43 and 44 at the beginning and the end of the phase pattern 42 are caused by the pulse 40 of FIG. 4 containing sine waves at the center frequency $f_o$ during the rise and fall times R and F thereof. The excursions of frequency only occur over the middle portion of the pulse within the arrows referred to at FIG. 8. This pattern as shown in FIG. 8 used to separate a possible phase and frequency ambiguity. The frequency to which the pulse is compared to provide the wave form of FIG. 8 is varied until there is no tilt to the phase pattern. This can be done accurately to within ±one kilohertz from the 30 megahertz center frequency. Phase can then be independently varied to yield a sequence of expected phase patterns in accordance with the generated code.

Figure 10:
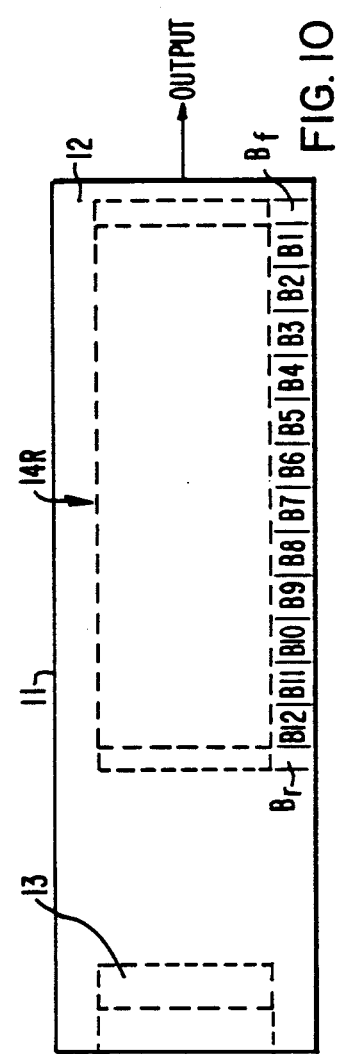
FIG. 10 is a diagrammatic representation of a device according to the present invention for decoding a pulse encoded by the device of FIG. 1.

FIG. 10 illustrates diagrammatically the SAW device of the present invention configured as a decoder for decoding a pulse encoded by the same pattern 14 in the encoder of FIG. 1. Like reference numerals refer to similar portions of the device 10 of FIG. 1. When used as a decoder the encoded pulse 40 of FIG. 4 is applied to a conventional input as shown in FIG. 10 for application to a metallized pattern similar to 13 of FIG. 1. A decoding pattern referred to as 14R is the same as the encoding pattern 14 of FIG. 1, except that it is reversed so that the pulse after leaving the pattern 13 first encounters the interdigitated fingers corresponding to B12, then B11, and so on until it leaves the fingers B1 to be converted to an electrical signal corresponding to the decoded pulse of FIG. 9. It is understood that if the encoder of FIG. 1 were used as a decoder then the encoder would be similar to FIG. 10.

Figure 9:
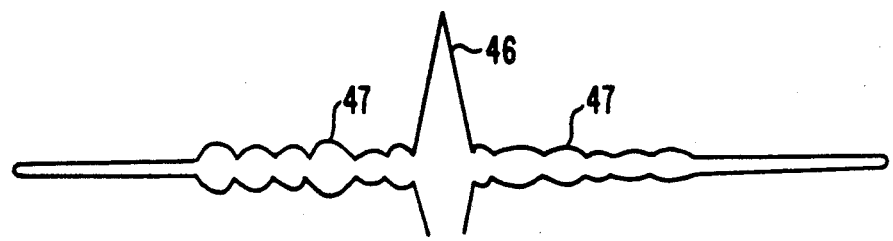
FIG. 9 illustrates a correlated pulse at the output of a device constructed in accordance with the present invention when utilized as a decoder.

The waveform 46 of FIG. 9, which represents the resulting pulse when a pulse such as 40 of FIG. 4 corresponding to the code is propagated in a direction from left to right as viewed in FIG. 10 has peak side lobes referred to at 47 which are actually approximately 21 dB less than the maximum or peak of the pulse 46. The remaining side lobes adjacent the side lobes 47 are more than 22 dB less than the maximum amplitude of the pulse. The uneven level of the side lobes is caused by a combination of filtering in the device 10 and the taper in the generated code pattern 40 as mentioned in connection with FIG. 4. In actual practice with a 50 ohm source and load impedance, the insertion loss when the device is used as a decoder is approximately 13 dB.

Although the description of the present embodiment contemplates a 30 megahertz center frequency, such a device could be utilized from 5 to approximately 1,000 megahertz. Although a specific coding pattern was described, it is understood that other coding patterns may be utilized and that the bit width and spacing may be determined in accordance with preceding discussion. Also, that although a phase change of 90° was described, a phase change of 120° or any other uniform phase change for each bit may be utilized if desired in accordance with the present invention.

What is claimed is:

1. A surface acoustic wave coding device for phase shifting a pulse in accordance with a selected code having a predetermined number of binary bits, comprising:
   a piezoelectric substrate having a polished surface;
   a first and a second distinct continuous metallic array disposed on the polished surface of the substrate, said second continuous array being spaced from the first continuous array in the direction of wave propagation a predetermined distance to provide electrical isolation therebetween, each said array having a plurality of spaced interdigitated fingers, each said finger having a length dimension extending transverse to the direction of wave propagation and a width dimension extending in the direction of wave propagation, said spaced fingers of each array being disposed in succession along the length of the substrate surface in the direction of wave propagation;
   said first array for controlling rise and fall times of the coded pulse having fingers with a width dimension and spacing therebetween to correspond to a selected center frequency;
   said second array being of a length in a direction of wave propagation corresponding to a predetermined number of code bit lengths occurring in succession in the direction of wave propagation, said bit lengths of the array each having finger width and spacing corresponding to two selected frequencies different from said center frequency; said two frequencies being selected to linearly shift the phase of a propagated waveform a predetermined number of degrees during each bit length of the propagated pulse.

2. A device according to claim 1 wherein selected ones of said fingers of the first array have a length dimension to provide a weighted pulse.

3. A device according to claim 1 or 2 wherein the largest distance between any adjacent fingers of the total second array is no greater than the finger width spacing corresponding to the largest fingers width spacing of a frequency shift of the array.

4. A device according to claim 1 or 2 wherein the selected frequencies of the bit length portions correspond to respective frequencies for shifting the phase of a propagated waveform 90° during each bit length.

5. A device according to claim 1 or 2 wherein the finger widths and spacing therebetween for first binary bits correspond to a frequency higher than the center frequency by an amount to change the phase continuously during each said binary bit in one direction a predetermined amount, and wherein the finger widths and spacing therebetween for second binary bits correspond to a frequency lower than the center frequency by an amount to change the phase continuously in the opposite direction by of said predetermined amount during each said second binary bits.

6. A device according to claim 5 wherein each bit lengths differ in number from an even multiple of wavelengths of the center frequency by a selected fraction of one wavelength, and each finger width and space width in the bit length differs equally in dimension by an equal portion of the selected fraction.

7. A device according to claim 6 wherein each bit length is at least equal to one period of the wavelength of the center frequency.

8. The device according to claim 6 wherein the selected fraction is one-quarter of the wavelength of the center frequency.

9. A device according to claim 6 wherein the higher and lower frequencies differ from the center frequency by an equal number of Hertz.

10. A device according to claim 6 wherein the selected center frequency is 30 megahertz and the higher and lower frequencies are 30.5 megahertz and 29.5 megahertz respectively.

* * * * *